United States Patent [19]
Lee et al.

[11] Patent Number: 6,100,158
[45] Date of Patent: Aug. 8, 2000

[54] METHOD OF MANUFACTURING AN ALIGNMENT MARK WITH AN ETCHED BACK DIELECTRIC LAYER AND A TRANSPARENT DIELECTRIC LAYER AND A DEVICE REGION ON A HIGHER PLANE WITH A WIRING LAYER AND AN ISOLATION REGION

[75] Inventors: Tzung-Han Lee, Taipei; Kun-Chi Lin, Hsinchu; Horng-Nan Chern, Tainan Hsien; Alex Hou, Kaohsiung, all of Taiwan

[73] Assignee: United Microelectronics Corp., Taiwan

[21] Appl. No.: 09/302,884

[22] Filed: Apr. 30, 1999

[51] Int. Cl.[7] .................................................. H01L 21/76
[52] U.S. Cl. .......................................... 438/401; 438/462
[58] Field of Search ............................................... 438/401

[56] References Cited

U.S. PATENT DOCUMENTS

| | | | |
|---|---|---|---|
| 5,786,260 | 7/1998 | Jang et al. | 438/401 |
| 5,919,714 | 7/1999 | Chen et al. | 438/692 |
| 5,958,800 | 9/1999 | Yu et al. | 438/720 |
| 5,963,816 | 10/1999 | Wang et al. | 438/401 |
| 6,015,744 | 1/2000 | Tseng | 438/401 |
| 6,020,249 | 2/2000 | Shih et al. | 438/401 |
| 6,043,133 | 3/2000 | Jang et al. | 438/401 |

*Primary Examiner*—Charles Bowers
*Assistant Examiner*—William M. Brewster
*Attorney, Agent, or Firm*—Martine Penilla & Kim, LLP

[57] ABSTRACT

A method of manufacturing an alignment mark. A substrate having a device region and an alignment mark region is provided. The device region is higher than the alignment mark region. The device region comprises an active region. An isolation structure is formed in the substrate at the edge of the alignment mark region and a first dielectric layer is formed over a portion of the substrate at the alignment mark region, simultaneously. A conductive layer is formed over the substrate. A portion of the conductive layer is removed to expose the first dielectric layer at the alignment mark region. The remaining conductive layer is patterned to form a component at the active region. A second dielectric layer with a smooth surface is formed over the substrate to cover the component. A wire is formed on the second dielectric layer, wherein a distance between the wire and the alignment mark region is larger than a distance between the component and the alignment mark region.

13 Claims, 4 Drawing Sheets

METHOD OF MANUFACTURING AN ALIGNMENT MARK WITH AN ETCHED BACK DIELECTRIC LAYER AND A TRANSPARENT DIELECTRIC LAYER AND A DEVICE REGION ON A HIGHER PLANE WITH A WIRING LAYER AND AN ISOLATION REGION

BACKGROUND OF THE INVENTION

1. Field of the Invention

The present invention relates to a method of manufacturing a semiconductor device. More particularly, the present invention relates to a method of manufacturing an alignment mark.

2. Description of the Related Art

The photolithography process is a technique used to replicate the required pattern into the surface of the wafer, and it is one of the major processes in semiconductor fabrication. The fine circuit diagram becomes more complex as the semiconductor process is continuously improved, so that more and more masks are used in the photolithography process. Typically, in order to accurately replicate the pattern on the mask into the surface of the wafer, the mask must align with the target location in the wafer before the photoresist has been exposed. If misalignment occurs during pattern replication, the replication fails and the wafer is wasted. In the alignment process, the wafer is first localized through a V-shaped notch in the wafer. Alignment marks are formed over the wafer. Then each mark in the mask is aligned with each alignment mark on the wafer. An alignment light shines through each mark of the mask to generate the diffraction light. The diffraction light is received by the alignment sensor to determine whether the mask is aligned with the wafer.

Currently, in the multilevel interconnects process, a dielectric layer is deposited over the substrate after an interconnect layer is formed. Several contact holes or via holes are formed in the dielectric layer and a metal layer is formed over the dielectric layer and fills the contact holes or the via holes. A chemical-mechanical polishing (CMP) is performed to form plugs in the dielectric layer. A subsequent interconnect layer is formed over the dielectric layer. Hence, a multi-layer structure is formed in the integrated circuit product.

However, the step height and the configuration specificity of the alignment marks become indistinct due to the coverage of the multilayer under the alignment marks as the numbers of the deposition layer increases. Therefore, the diffraction light is weak. Additionally, the reflectance and the refraction of each layer in the multilayer structure are different because the materials of each layer in the multilayer structure are different. Hence, the alignment signal is weak or the noise ratio is large. Therefore, the misalignment occurs.

SUMMARY OF THE INVENTION

The invention provides a method of manufacturing an alignment mark. By using the invention, the misalignment, the peeling effect and contamination by particles can be avoided.

To achieve these and other advantages and in accordance with the purpose of the invention, as embodied and broadly described herein, the invention provides a method of manufacturing an alignment mark. A substrate having a device region and an alignment mark region is provided. The device region is higher than the alignment mark region. The device region comprises an active region. An isolation structure is formed in the substrate at the edge of the alignment mark region and a first dielectric layer is formed over a portion of the substrate at the alignment mark region, simultaneously. A conductive layer is formed over the substrate. A portion of the conductive layer is removed to expose the first dielectric layer at the alignment mark region. The remaining conductive layer is patterned to form a component in the active region. A second dielectric layer with a smooth surface is formed over the substrate to cover the component. A wire is formed on the second dielectric layer, wherein a distance between the wire and the alignment mark region is larger than a distance between the component and the alignment mark region.

Since the first and the second dielectric layers are transparent, the mark in the mask can be accurately aligned with the alignment mark. Therefore, the pattern can be accurately replicated into the target location on the wafer. Moreover, because the component is covered by the second dielectric layer, the peeling effect will not happen. Furthermore, since the distance between the wire and the alignment mark region is larger than the distance between the component and the alignment mark region, the alignment mark region 104 will not be affected by the spacer subsequently formed on the wire.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
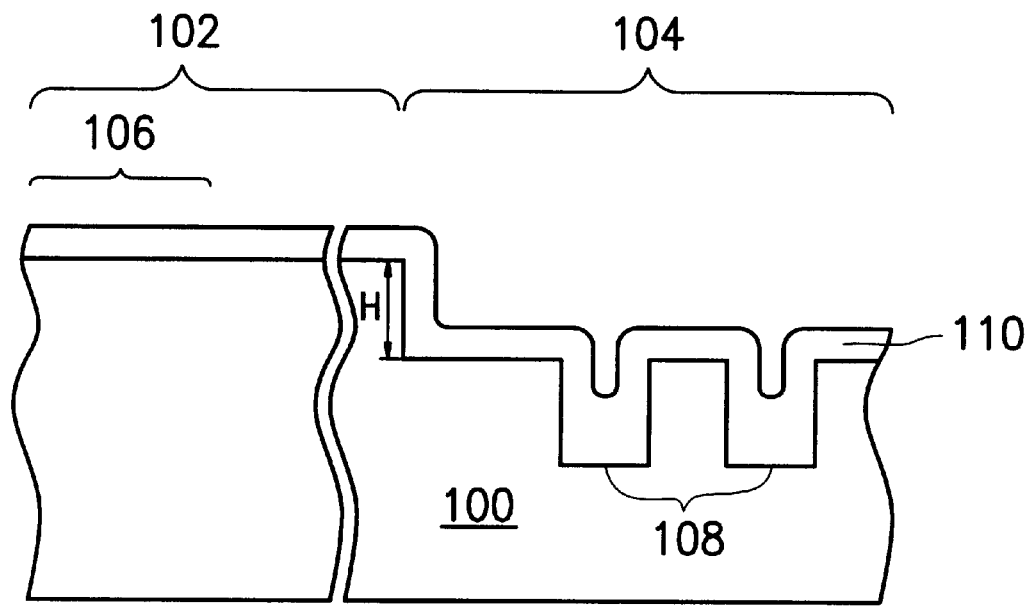
Figs. 1A through 1H are schematic, cross-sectional views of the process for manufacturing an alignment mark in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

Figs. 1A through 1H are schematic, cross-sectional views of the process for manufacturing an alignment mark in a preferred embodiment according to the invention.

As shown in Fig. 1A, a substrate 100 is provided. The substrate is divided into a device region 102 and an alignment mark region 104. The device region 102 is higher than the alignment mark region 104. The step height between the device region 102 and the alignment mark region 104 is denoted as step height H. The device region further comprises an active region 106 used to produce a device (not shown). An alignment mark 108 with a width of about 8 microns is formed in the alignment mark region 104. A mask layer 110 is formed over the substrate 100 and is formed in the alignment mark 108. The mask layer 110 can be formed from silicon nitride by chemical vapor deposition (CVD), for example.

Figure 1B:
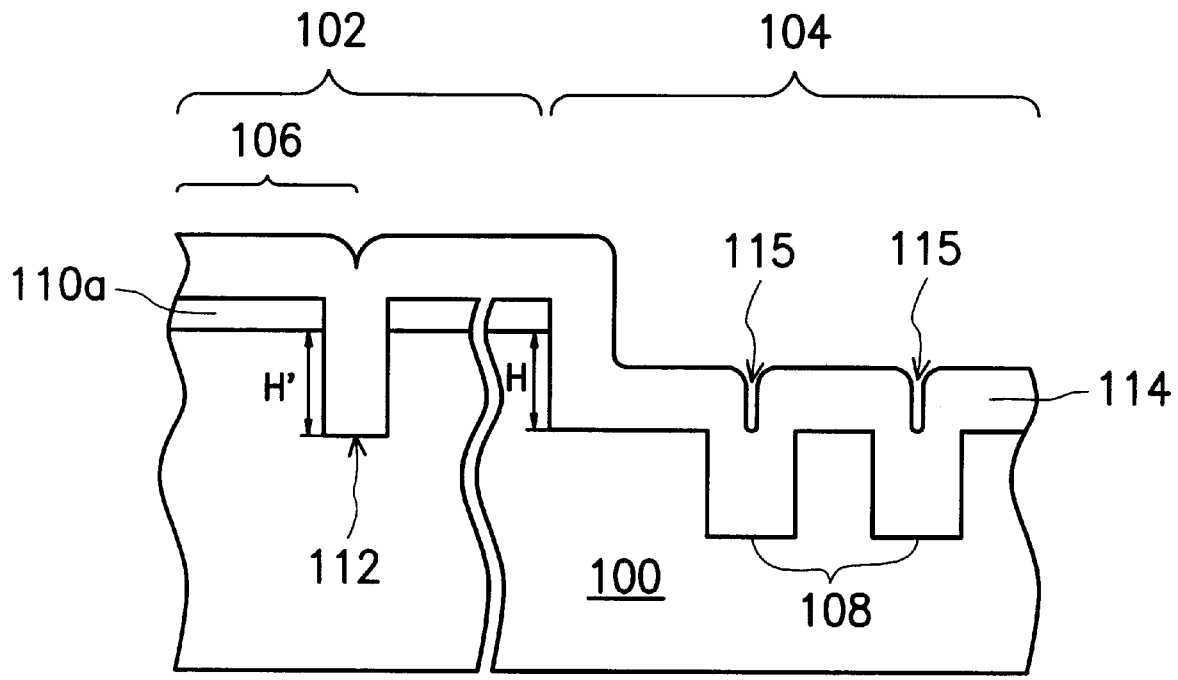

As shown in FIG. 1B, a photolithography process and an etching process are performed to pattern the mask layer 110 and to remove a portion of the mask layer die 100. Therefore, a portion of the substrate 100 in the alignment mark region 104 is exposed. The remaining mask layer 110 covering the device region is denoted as mask layer 110a. A trench 112 used to isolate the subsequently formed devices from each other is formed in the substrate 100 at the edge of the alignment mark region 104. The trench 112 can be a shallow trench formed by anisotropic etching, for example. The depth of the trench 112 is denoted as depth H'. The depth H' is similar to the step height H. A liner oxide layer (not shown) and an original dielectric layer 114 with a transparent specificity are formed over the substrate 100 in sequence. Since the original dielectric layer 114 is thick, a void 115 is formed over the alignment mark 108 with the formation of the original dielectric layer 114. The original dielectric layer 114 fills the trench 112 and the alignment mark 108. The liner oxide layer can be formed by thermal process, for example. The original dielectric layer 114 can be formed from silicon oxide or borophosphosilicate glass by atmospheric pressure chemical vapor deposition (APCVD) or low-pressure chemical vapor deposition (LPCVD), for example. The thickness of the original dielectric layer is about 8000 angstroms.

Figure 1C:
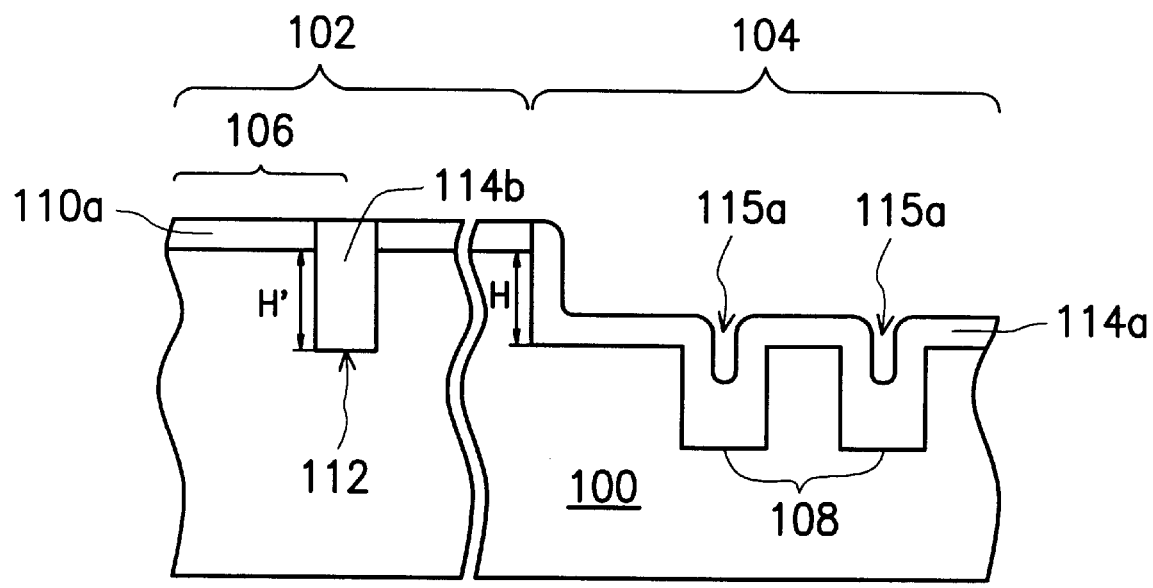

As shown in Fig. 1C, a portion of the original dielectric layer 114 is removed to form an isolation structure 114b and a dielectric layer 114a over the alignment mark region 104 in the trench 112 until the mask layer 110a is exposed. The method of removing the portion of the original dielectric layer can be etching back or CMP, for example. The thickness of the dielectric layer 114a is about 4000 angstroms. Because the dielectric layer 114a is thinner than the original dielectric layer 114, the void 115 (as shown in FIG. 1B) becomes larger and is transformed into a void 115a (as shown in Fig. 1C) with a relatively large opening.

Figure 1D:
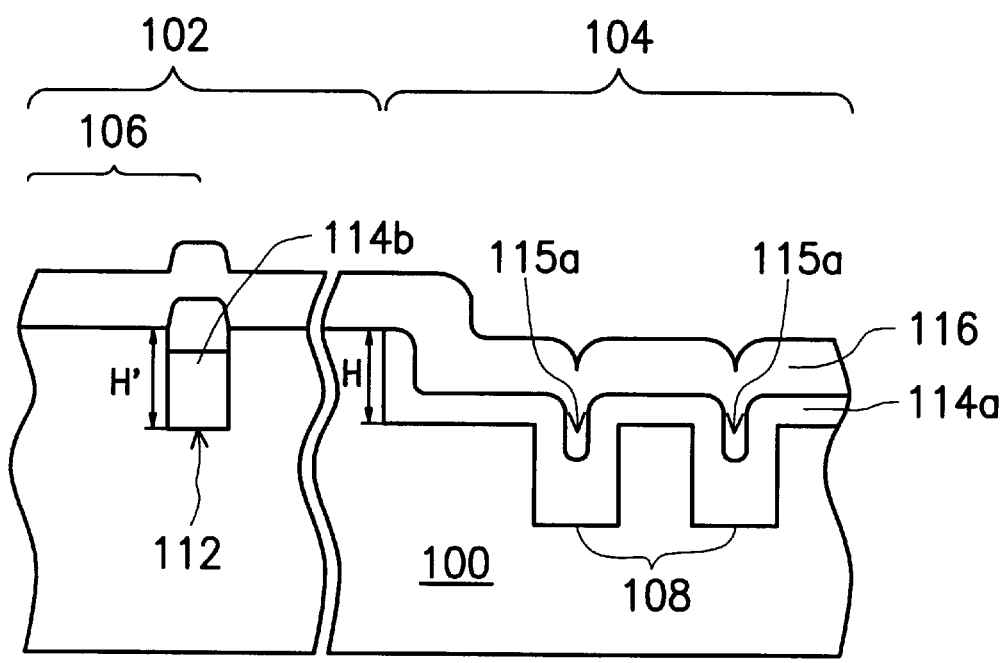

As shown in Fig. 1D, the mask layer 110a is removed to expose the substrate 100 in the device region 102. The method of removing the mask layer 110a can be wet dipping, for example. A conductive layer 116 is formed over the substrate 100. The conductive layer 116 can be formed from polysilicon or metal material by CVD, for example.

Figure 1E:
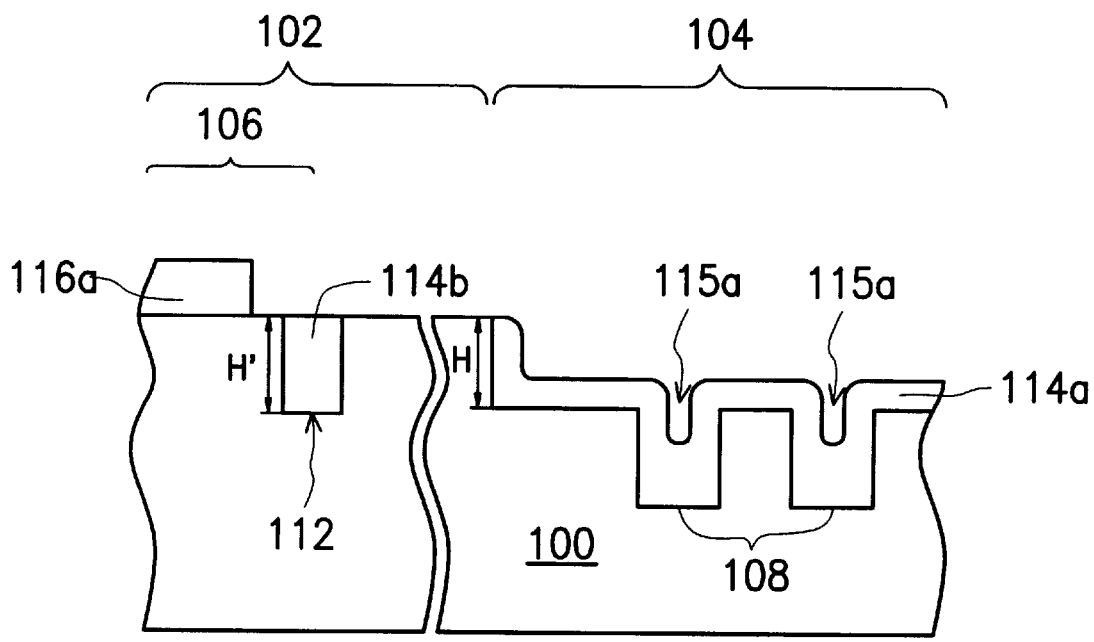

As shown in Fig. 1E, a portion of the conductive layer 116 over the alignment mark region 104 is removed to expose the dielectric layer 114a. The void 115a has relatively large opening, so that a portion of the conductive layer 116 in the alignment mark 108 is entirely removed. Therefore, the particle contamination of the substrate due to conductive layer residue can be avoided. Since the dielectric layer 114a is transparent, a mark of a mask (not shown) with a pattern (not shown) subsequently replicated into the conductive layer 116 can accurately align with the alignment mark 108 through the dielectric layer 114a. The remaining conductive layer 116 over the device region is patterned to form a component 114a on the substrate 100 in the active region 106 and to expose the dielectric layer 114a in the alignment mark region 104. Simultaneously, the surface level of the isolation structure 114b is substantially equal to the surface level of the substrate 100 in the device region 102. Because the mark of the mask accurately and directly aligns with the alignment mark 108, the pattern can be accurately replicated into the remaining conductive layer 116 over the device region 102. The component 116a can be a gate electrode of a gate structure or an interconnect layer, for example. If the component 114a is a gate electrode, the subsequent process is performed to form a semiconductor device (not shown) with a source/drain region (not shown) in the substrate 100 at the device region 102.

Figure 1F:
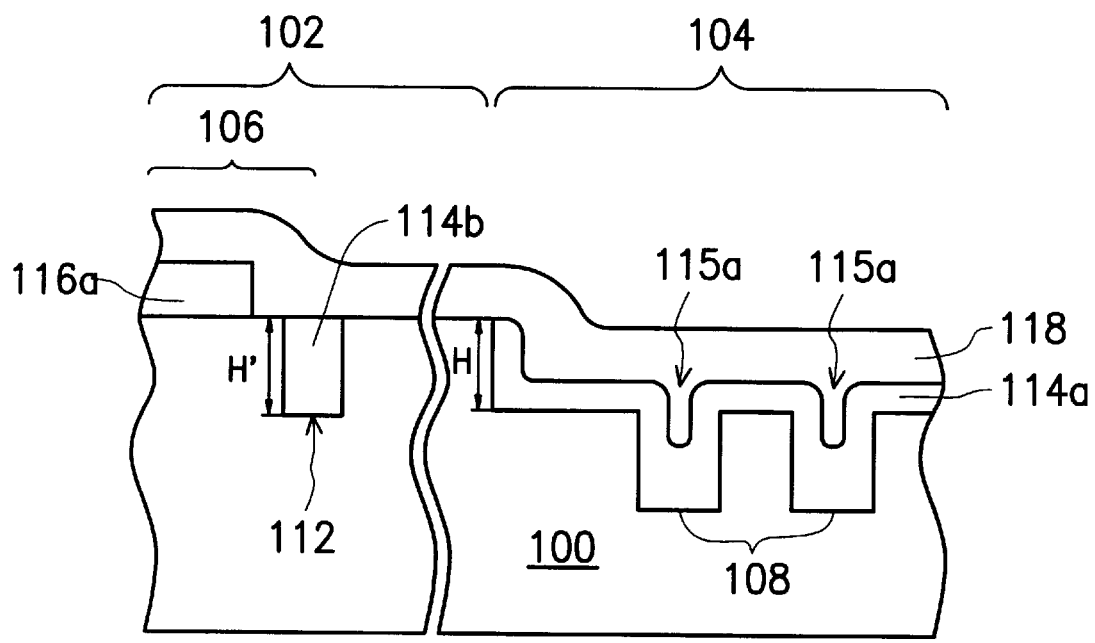

As shown in Fig. 1F, a dielectric layer 118 with a smooth surface and a transparent specificity is formed over the substrate 100. The dielectric layer 118 can be an inter-layer dielectric (ILD) layer or an inter-metal dielectric (IMD) layer, for example. The dielectric layer 118 can be formed from silicon oxide by CVD. The smooth surface of the dielectric layer 118 can be obtained by performing CMP. The dielectric layer can be also formed by spin-on glass (SOG), for example.

Figure 1G:
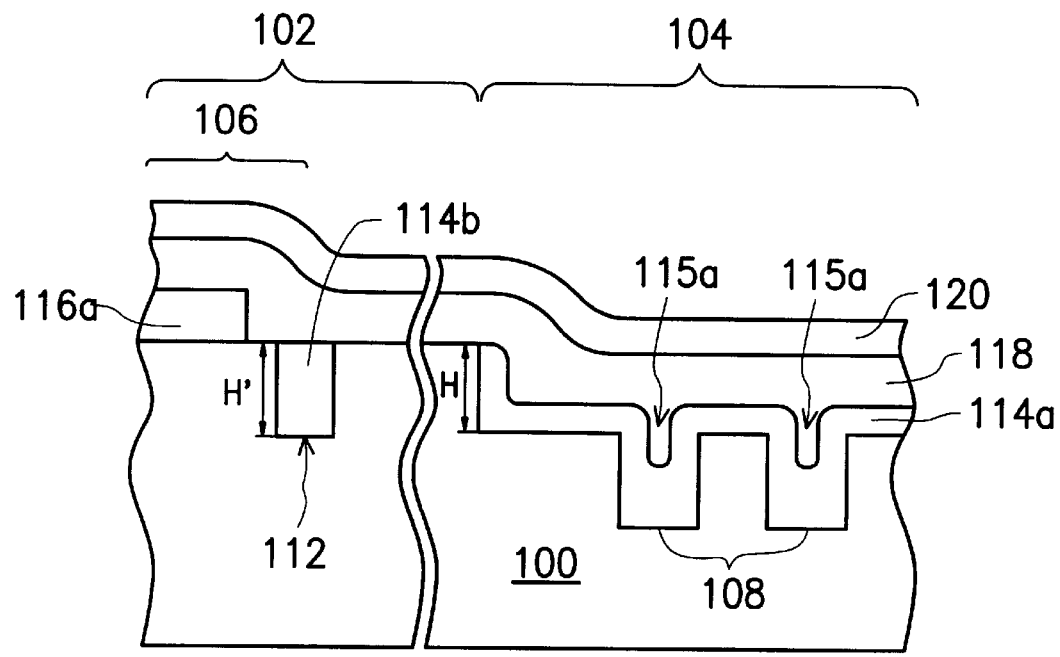

As shown in Fig. 1G, a conductive layer 120 is formed on the dielectric layer 118. The conductive layer can be formed from aluminum or copper by physical vapor deposition or CVD, for example.

Figure 1H:
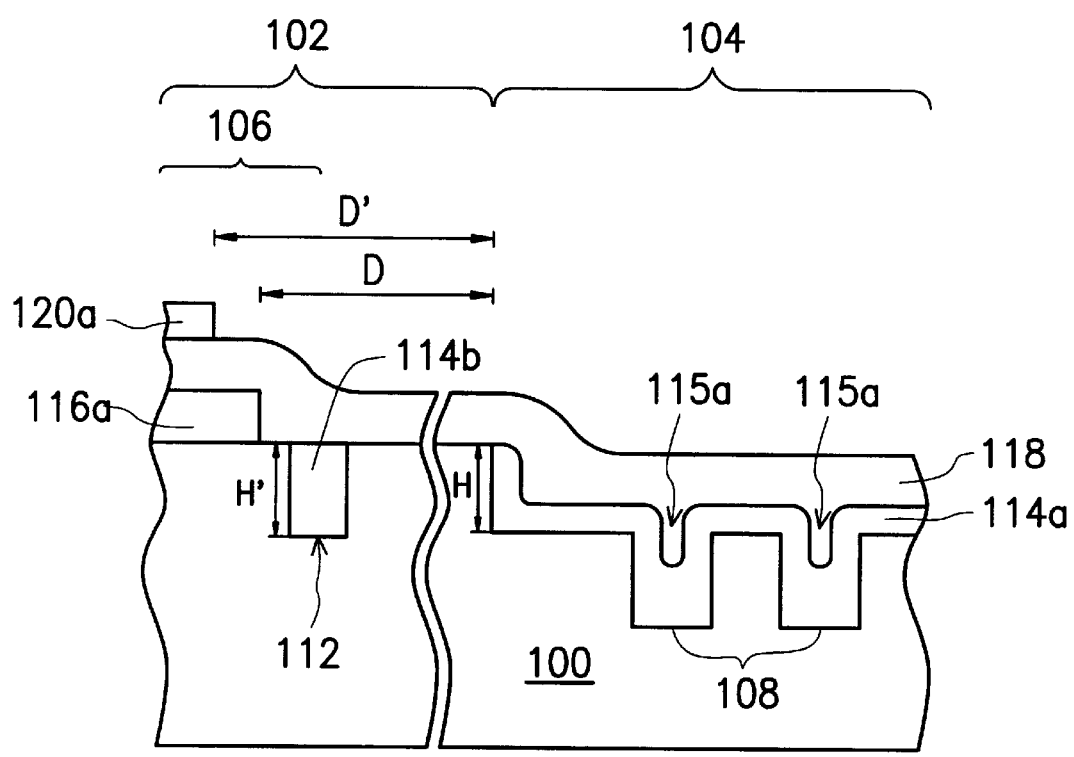

As shown in Fig. 1H, a portion of the conductive layer 120 over the alignment mark region 104 is removed to expose a portion of the dielectric layer 118 in the alignment mark region 104. Since the dielectric layers 118 and 114a have a transparent specificity, a mark of a mask (not shown) with a pattern (not shown) subsequently replicated into the conductive layer 120 can accurately align with the alignment mark 108 through the dielectric layers 118 and 114a. The remaining conductive layer 120 is patterned to form a wire 120a in the device region 102.

Since the mark of the mask accurately and directly aligns with the alignment mark 108, the pattern can be accurately replicated into the remaining conductive layer 120 over the device region 102. A distance between the component 116a and the alignment mark region 104 is denoted as distance D. A distance between the wire 120a and the alignment mark region 104 is denoted as distance D'. As shown in Fig. 1H, the distance D' is larger than the distance D. Hence, a safety margin D'–D exists between the wire 120a and the component 116a.

In the invention, in order to conveniently align the mask with the target location of the wafer, the layers formed above the alignment mark region 104 are selectively removed and only transparent dielectric layers cover the alignment mark region 104. Therefore, it is good for the performance of the subsequent alignment process, that the mask and the target location of the wafer are aligned. Hence, the pattern on the mask can be accurately replicated into the target location of the wafer. The misalignment due to the different reflectance and the different refraction of different layers can be avoided.

Additionally, since the isolation structure 114b is formed simultaneously with the formation of the dielectric layer 114a by removing a portion of the original dielectric layer 114, the dielectric layer 114a is thinner than the original dielectric layer 114. Therefore, the void 115a has a relatively large opening. Hence, the conductive layer formed in the void 115a can be easily and completely removed. The particle contamination due to the conductive layer residue in the void over the alignment mark 108 can be avoided. Moreover, since the distance D' is larger than the distance D, a spacer subsequently formed on the wire 120a will not be formed in the alignment mark region 104. Consequently, the alignment mark region 104 will not be affected by the spacer. Incidentally, because the component 114a is covered by the dielectric layer 118 and the wire 120 is formed on the dielectric layer 118, the component 116a cannot touch the wire having titanium nitride material. Hence, the peeling effect will not happen.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing an alignment mark formed in a substrate having a device region and an alignment mark region, wherein the device region is higher than the alignment mark region and the device region comprises an active region, the method comprising the steps of:

forming an isolation structure in the substrate at the edge of the alignment mark region and forming a first dielectric layer over a portion of the substrate at the alignment mark region, simultaneously;

forming a conductive layer over the substrate;

removing a portion of the conductive layer to expose the first dielectric layer at the alignment mark region;

patterning the remaining conductive layer to form a component at the active region;

forming a second dielectric layer with a smooth surface over the substrate to cover the component; and forming a wire on the second dielectric layer, wherein a distance between the wire and the alignment mark region is larger than a distance between the component and the alignment mark region.

2. The method of claim 1, wherein the step of forming the isolation structure and the first dielectric layer further comprises the steps of:

forming a mask layer over a portion of the substrate in the device region;

forming a trench in the substrate at the edge of the alignment mark region;

forming an original dielectric layer over the substrate;

removing a portion of the original dielectric layer to form the isolation structure and the first dielectric layer; and removing the mask layer.

3. The method of claim 2, wherein the mask layer can be a silicon nitride layer formed by chemical vapor deposition.

4. The method of claim 2, wherein the step of forming the original dielectric layer includes chemical vapor deposition.

5. The method of claim 2, wherein the original dielectric layer has a transparent specificity.

6. The method of claim 2, wherein the original dielectric layer can be a silicon oxide layer formed by chemical vapor deposition.

7. The method of claim 2, wherein the thickness of the original dielectric layer is about 8000 angstroms.

8. The method of claim 2, wherein the step of removing a portion of the original dielectric layer includes etching back.

9. The method of claim 2, wherein the step of removing a portion of the original dielectric layer includes chemical-mechanical polishing.

10. The method of claim 1, wherein the thickness of the first dielectric layer is about 4000 angstroms.

11. The method of claim 1, wherein the step of forming the second dielectric layer with a smooth surface includes chemical-mechanical polishing.

12. The method of claim 1, wherein the step of forming the second dielectric layer with a smooth surface includes spin-on glass.

13. The method of claim 1, wherein the second dielectric layer has a transparent specificity.

* * * * *